(12) United States Patent
Park

(10) Patent No.: US 9,847,114 B2
(45) Date of Patent: *Dec. 19, 2017

(54) ELECTRONIC DEVICE

(71) Applicant: SK hynix Inc., Icheon-Si (KR)

(72) Inventor: Ji-Ho Park, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/488,462

(22) Filed: Apr. 15, 2017

(65) Prior Publication Data

US 2017/0221539 A1 Aug. 3, 2017

Related U.S. Application Data

(63) Continuation of application No. 14/624,398, filed on Feb. 17, 2015, now Pat. No. 9,628,078.

(30) Foreign Application Priority Data

Jul. 8, 2014 (KR) .................. 10-2014-0085088

(51) Int. Cl.
| | | |
|---|---|---|
| *G11C 11/16* | (2006.01) | |
| *G11C 7/06* | (2006.01) | |
| *G11C 7/12* | (2006.01) | |
| *H03K 19/017* | (2006.01) | |
| *H01L 43/02* | (2006.01) | |
| *H03K 19/0948* | (2006.01) | |
| *H01L 43/10* | (2006.01) | |
| *H01L 45/00* | (2006.01) | |

(52) U.S. Cl.
CPC .......... *G11C 11/1673* (2013.01); *H01L 43/02* (2013.01); *H01L 43/10* (2013.01); *H01L 45/06* (2013.01); *H03K 19/0948* (2013.01)

(58) Field of Classification Search
CPC .. G11C 7/06; G11C 7/12; G11C 11/15; G11C 11/16; H03K 19/01742
See application file for complete search history.

(56) References Cited

U.S. PATENT DOCUMENTS

| | | | |
|---|---|---|---|
| 6,570,405 B1 | 5/2003 | Lien | |
| 7,339,818 B2 | 3/2008 | Katti et al. | |
| 7,880,502 B2 | 2/2011 | Kawakami et al. | |
| 8,004,882 B2 * | 8/2011 | Katti | G11C 11/16 365/148 |

(Continued)

FOREIGN PATENT DOCUMENTS

KR  10-2004-0048036  6/2004

*Primary Examiner* — Tri Hoang
(74) *Attorney, Agent, or Firm* — Perkins Coie LLP

(57) ABSTRACT

An electronic device including an inverter includes a pull-up driving unit configured to drive an output node with a high voltage in response to an input signal; a path switching unit coupled in a path between the pull-up driving unit and the output node according to a direction of a first current flowing between the pull-up driving unit and the output node and operable to selectively switch on or off the path; a pull-down driving unit coupled to the output node to supply a low voltage in response to the input signal; a path blocking unit coupled in a path between the pull-down driving unit and the output node to block the path; and a bypass unit coupled to form a bypass path between the pull-down driving unit and the output node.

11 Claims, 10 Drawing Sheets

(56) References Cited

U.S. PATENT DOCUMENTS

| | | | |
|---|---|---|---|
| 8,406,064 B2* | 3/2013 | Jung | G11C 13/0002 |
| | | | 365/158 |
| 8,503,224 B2* | 8/2013 | Katti | G11C 11/16 |
| | | | 365/148 |
| 9,147,454 B2* | 9/2015 | Sun | G11C 11/1673 |
| 2012/0280713 A1 | 11/2012 | Katoh | |
| 2014/0198563 A1 | 7/2014 | Sun et al. | |

\* cited by examiner

FIG. 1

| FIRST ELECTORDE LAYER |
| --- |
| FIRST MAGNETIC LAYER |
| TUNNEL BARRIER LAYER |
| SECOND ELECTRODE LAYER |
| SECOND MAGNETIC LAYER |

(A)                    (B)

ELECTRONIC DEVICE

CROSS-REFERENCE TO RELATED APPLICATIONS

This patent document is a continuation of, and claims priority of and benefits of, U.S. patent application Ser. No. 14/624,398, published as US2016/0013793 A1, entitled "ELECTRONIC DEVICE," and filed on Feb. 17, 2015, now U.S. Pat. No. 9,628,078, which further claims priority and benefits of Korean Patent Application No. 10-2014-0085088, entitled "INVERTER AND ELECTRONIC DEVICE WITH THE SAME" and filed on Jul. 8, 2014. The contents of the before-mentioned patent applications (including US2016/0013793 A1) are incorporated herein by reference in their entirety as part of the disclosure of this document.

TECHNICAL FIELD

This patent document relates to inverting circuits or devices and their applications in electronic devices or systems.

BACKGROUND

In general, electronic devices or appliances such as a computer, a portable communication device, and so on include various circuits. For example, the electronic devices or appliances include input circuits, output circuits, various logical circuits, and so on, which include inverting circuits or devices.

Recently, as electronic devices or appliances trend toward miniaturization, low power consumption, high performance, multi-functionality, and so on, there is a demand for semiconductor devices capable of storing information in various electronic appliances such as a computer, a portable communication device, and so on, and research and development for such electronic devices have been conducted. Examples of such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes inverting circuits or devices and their applications in electronic devices or systems and various implementations of an inverter and an electronic device including the same for reducing a leakage current.

The disclosed technology in the patent document may improve a signal delay caused by a leakage current by reducing the leakage current during a transition of a signal, and improve reliability of a signal transmission.

In one aspect, an electronic device including an inverter is provided to include a pull-up driving unit configured to drive an output node with a high voltage in response to an input signal; a path switching unit coupled in a path between the pull-up driving unit and the output node according to a direction of a first current flowing between the pull-up driving unit and the output node and operable to selectively switch on or off the path; a pull-down driving unit coupled to the output node to supply a low voltage in response to the input signal; a path blocking unit coupled in a path between the pull-down driving unit and the output node to block the path; and a bypass unit coupled to form a bypass path between the pull-down driving unit and the output node.

Implementations of the above electronic device may include one or more the following.

The path blocking unit may be operable to change a resistance state to selectively connect the path between the pull-down driving unit and the output node according to a direction of a second current flowing between the pull-down driving unit and the output node. The path switching unit and the path blocking unit may perform a same operation when the direction of the first current is opposite to the direction of the second current, and perform an opposite operation when the direction of the first current is same as the direction of the second current. Each of the path switching unit and the path blocking unit includes a magnetic tunnel junction (MTJ) element. The path switching unit may include a free ferromagnetic layer and a pinned ferromagnetic layer, and the pinned ferromagnetic layer may be disposed closer to the output node than the free ferromagnetic layer. The path blocking unit may include a free ferromagnetic layer and a pinned ferromagnetic layer, and the free ferromagnetic layer may be disposed closer to the output node than the pinned ferromagnetic layer. The path switching unit includes a magnetic tunnel junction (MTJ) element and the path blocking unit includes a resistance element. The path switching unit may include a free ferromagnetic layer and a pinned ferromagnetic layer, and the pinned ferromagnetic layer may be disposed more adjacent to the output node than the free ferromagnetic layer.

In another aspect, an electronic device is provided to include a semiconductor memory unit that includes: a memory cell configured to store data; and a sense amplification unit configured to sense and amplify the data stored in the memory cell and to generate a differential read data representing a difference between a first read data and a second read data during a read operation, wherein the sense amplification unit comprises: a first pull-up driving unit configured to receive the first read data as an input thereof and drive an output node having the second read data with a high voltage; a first path switching unit configured to selectively connect a path between the first pull-up driving unit and the output node having the second read data according to a direction of a first current flowing between the first pull-up driving unit and the output node; a first pull-down driving unit configured to receive the first read data as an input thereof and drive the output node having the second read data with a low voltage; a first path blocking unit configured to block a path between the first pull-down driving unit and the output node having the second read data; a first bypass unit configured to form a bypass path between the output node having the second read data and a node between the first path blocking unit and the first pull-down driving unit; a second pull-up driving unit configured to receive the second read data as an input thereof and drive the output node having the first read data with the high voltage; a second path switching unit configured to selectively connect a path between the second pull-up driving unit and the output node having the first read data according to a direction of a second current flowing between the second pull-up driving unit and the output node having the positive read data; a second pull-down driving unit configured to receive the second read data as an input thereof and drive the output node having the first read data with the low voltage; a second path blocking unit configured to block a path between the second pull-down driving unit and the output node having the first read data; and a second bypass unit configured to form a bypass path between the output node having the first read data and a node between the second pull-down driving unit and the second path blocking unit.

Implementations of the above method may include one or more of the following.

The sense amplification unit may further include a first coupling unit configured to selectively couple the first pull-down driving unit to a low voltage terminal in response to a control signal of the sense amplification unit; and a second coupling unit configured to selectively couple the second pull-down driving unit to the low voltage terminal in response to the control signal. The memory unit may further include a reference cell configured to store a reference data corresponding to the data, wherein the reference cell is coupled to a node between the first pull-down driving unit and the first coupling unit, and the memory cell is coupled to a node between the second pull-down driving unit and the second coupling unit. The first path blocking unit may selectively connect a path between the first pull-down driving unit and the output node having the second read data according to a direction of a third current flowing between the first pull-down driving unit and the output node having the second read data, and the second path blocking unit may selectively connects a path between the second pull-down driving unit and the output node having the first read data according to a direction of a fourth current, which flows between the second pull-down driving unit and the output node having the first read data. The first path switching unit and the first path blocking unit may control the connection of the corresponding paths in the same or different manner depending on the direction of the first current relative to the direction of the third current and the second path switching unit and the second path blocking unit may control the connection of the corresponding paths in the same or different manner depending on the direction of the second current relative to the direction of the fourth current. Each of the first path switching unit, the second path switching unit, the first path blocking unit and the second path blocking unit may include a magnetic tunnel junction (MTJ) element. Each of the first path switching unit and the second path switching unit may include a magnetic tunnel junction (MTJ) element, and each of the first path blocking unit and the second path blocking unit may include a resistance element. The memory cell may include a variable resistance element of which a resistance value varies according to a current flowing the memory cell, and the variable resistance element may include at least one of a metal oxide, a phase change material or a structure having a tunnel barrier interposed between two magnetic layers. In another aspect, an electronic device is provided to include an inverter which includes: an inverter input node to receive an inverter input; an inverter output node to produce an inverter output corresponding to the inverter input; a first voltage terminal at a first voltage; a second voltage terminal at a second voltage; a pull-up driving unit coupled to the first voltage terminal and the inverter output node and configured to drive the inverter output node at the first voltage; a pull-down driving unit coupled to the second voltage terminal and the inverter output node and configured to drive the inverter output node at the second voltage; a path switching unit coupled between the pull-up driving unit and the inverter output node and configured to modify a connection property of a pull-up path between the pull-up driving unit and the inverter output node in response to a direction of a current flowing in the pull-up path; a path blocking unit coupled between the output node and the pull-down driving unit and configured to provide a high resistance in a path between the first and second voltage terminals; and a bypass unit coupled between the inverter output node and the pull-down driving unit to form a bypass path between the pull-down driving unit and the inverter output node.

Implementations of the above method may include one or more of the following.

The path switching unit or the path blocking unit may include a variable resistance element that exhibits different resistance states. The path switching unit or the path blocking unit may include a magnetic tunnel junction (MTJ) element. The path switching unit or the path blocking unit may include a phase change element.

In some implementations, each of the first path switching unit and the second path switching unit may include a free ferromagnetic layer and a pinned ferromagnetic layer, and the pinned ferromagnetic layer may be disposed more adjacent to the output node having the first read data or the second read data than the free ferromagnetic layer. In some implementations, each of the first path blocking unit and the second path blocking unit may include a free ferromagnetic layer and a pinned ferromagnetic layer, and the free ferromagnetic layer may be disposed more adjacent to the output node having the first read data or the second read data more than the pinned ferromagnetic layer. In some implementations, each of the first path switching unit and the second path switching unit may include a free ferromagnetic layer and a pinned ferromagnetic layer, and the pinned ferromagnetic layer may be disposed more adjacent to the output node having the first read data or the second read data than the free ferromagnetic layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor. In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that is part of the cache memory unit in the processor. In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system. In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system. In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

According to the above implementations, a signal delay caused by the leakage current may be improved by reducing the leakage current occurring in the transition of a signal, and an electronic device may reduce a current consumption and improve reliability of a signal transfer.

BRIEF DESCRIPTION OF THE DRAWINGS

FIG. 1 is a configuration diagram illustrating a magnetic tunnel junction (MTJ) having a tunnel barrier layer interposed between two magnetic layers.

DETAILED DESCRIPTION

Figure 2A:
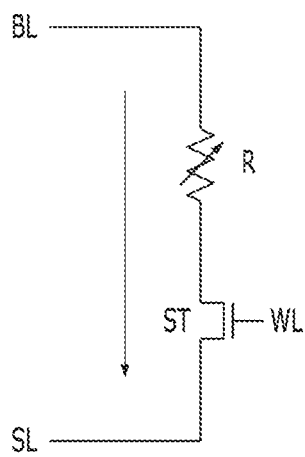
FIGS. 2A and 2B are examples of configuration diagrams illustrating a concept of storing data in a variable resistance element.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single layer or a multi layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO: SrTiO) and/or a praseodymium calcium manganese oxide (PCMO: PrCaMnO).

Moreover, the variable resistance element may include a phase change material. The phase change material may include a chalcogenide material such as germanium-antimony-tellurium (GST: GeSbTe). The variable resistance element switches between different resistance states by changing a crystal state or an amorphous state using a heat.

Also, the variable resistance element may include a structure having a tunnel barrier interposed between two magnetic layers. The magnetic barrier may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to a magnetization direction of the magnetic layer. For example, the variable resistance element may be in a low resistance state when a magnetization direction of two magnetic layers is parallel, and be in a high resistance state when a magnetization direction of two magnetic layers is anti-parallel.

FIG. 1 is a configuration diagram illustrating a magnetic tunnel junction (MTJ) having a tunnel barrier layer interposed between two magnetic layers.

Referring to FIG. 1, a magnetic tunnel junction (MTJ) includes a first electrode layer as an upper electrode, a second electrode layer as a lower electrode, first and second magnetic layers and a tunnel barrier layer interposed between the first magnetic layer and the second magnetic layer.

The first magnetic layer may be or include a free ferromagnetic layer of which a magnetization direction is variable according to a current direction applied to the MTJ, and the second magnetic layer may be or include a pinned ferromagnetic layer of which a magnetization direction is fixed. The resistance of the MTJ varies with the magnetization direction of the free ferromagnetic layer relative to the magnetization direction of the fixed ferromagnetic layer and thus have two different resistance values (i.e., high and low resistance values) corresponding to two different relative directions. The MTJ stores data such as binary data having a value of "0" or "1" represented by low or high resistance values and can change the resistance values (and such the stored data) by changing a resistance value according to a current direction applied to the MTJ.

Figure 2B:
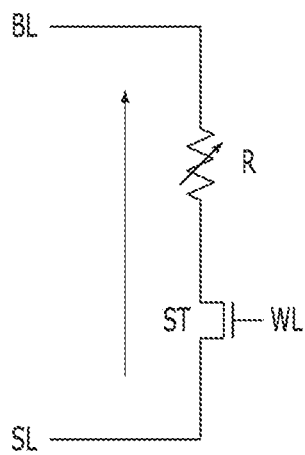

FIGS. 2A and 2B are examples of configuration diagrams illustrating a concept of storing data in a variable resistance element. As one example, the variable resistance element may be configured as the MTJ shown in FIG. 1.

FIG. 2A is an example of a configuration diagram illustrating a concept of storing data having a low logic value in the variable resistance element. To select a variable resistance element R in which data is to be stored, a word line WL is coupled to the variable resistance element R and is activated to turn on a transistor ST.

If a current flows from a terminal of the variable resistance element R to the other terminal of the variable resistance element R, for example, from the first electrode layer as the upper electrode to the second electrode layer as the lower electrode as shown in FIG. 1, a magnetization direction of the first magnetic layer as the free ferromagnetic layer and a magnetization direction of the second magnetic layer as the pinned ferromagnetic layer are parallel to each other, and the variable resistance element R becomes in a low resistance state. When the variable resistance element R becomes in the low resistance state, it is defined that the data having a low logic value is stored in the variable resistance element R.

FIG. 2B is an example of a configuration diagram illustrating a concept of storing data having a high logic value on the variable resistance element. In a similar manner, the word line WL coupled to the variable resistance element R is activated to turn on the transistor ST.

If a current flows from the other terminal of the variable resistance element R to the other terminal of the variable resistance element R, that is, from the second electrode layer as the lower electrode to the first electrode layer as upper electrode as shown in FIG. 1, a magnetization direction of the first magnetic layer as the free ferromagnetic layer and a magnetization direction of the second magnetic layer as the pinned ferromagnetic layer are anti-parallel to each other, and the variable resistance element R becomes in a high resistance state. When the variable resistance element R becomes in the high resistance state, it is defined that the data having a high logic value is stored in the variable resistance element R.

The logic value of the data stored in the variable resistance element R is varied according to a resistance value of the variable resistance element R. If a difference of a resistance value between the high resistance state and the low resistance state is relatively large, it is easy to determine the data stored in the variable resistance element R because this relatively large difference can be determined against noise or background with a relatively high margin. If a difference of the resistance value between the high resistance state and the low resistance state is relatively small, it can be difficult to determine the data stored in the variable resistance element R because the measurement of this relatively small difference can be adversely affected by noise or background so that the probability that an error occurs in determining the data increases. Thus, for the case that the difference of the resistance value between the high resistance state and the low resistance state is small, a technique which enables to correctly determine the data stored in the variable resistance element R is needed.

Figure 3:
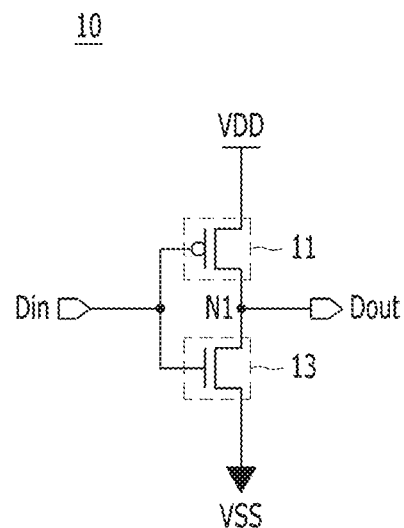
FIG. 3 is an example of a configuration diagram illustrating an inverter that is provided for a comparison example.

FIG. 3 is a configuration diagram illustrating an inverter that is provided for a comparison.

Referring FIG. 3, an inverter 10 may include a pull-up driving unit 11 for driving an output node N1 with a high voltage VDD in response to an input signal DIN and a pull-down driving unit 13 for driving the output node N1 with a low voltage VSS in response to the input signal DIN. An output signal DOUT may be generated at the output node N1.

The pull-up driving unit 11 may include a PMOS transistor having a gate coupled to the input node which receives the input signal Din, and a source and a drain coupled between the output node N1 and a high voltage VDD terminal. The pull-down driving unit 13 may include an NMOS transistor having a gate coupled to the input node, and a source and a drain coupled between the output node N1 and a low voltage VSS terminal.

Hereinafter, an operation of the inverter 10 having the configuration as described above will be described with reference to FIG. 2.

Figure 4:
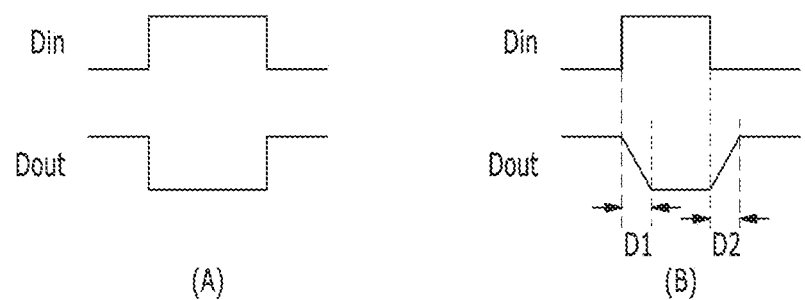
FIG. 4 is an example of a timing diagram explaining an operation of an inverter shown in FIG. 3.

FIG. 4 is an example of a timing diagram explaining an operation of an inverter shown in FIG. 3.

Referring to FIG. 4, the inverter 10 may generate an output signal DOUT that has an inverted value of the input signal DIN in response to the input signal DIN. A generation of the output signal DOUT without a delay is ideal, but a delay D1 and D2 of the output signal DOUT may actually occur since a leakage current generates in the inverter 10 due to manufacturing properties of the pull-up driving unit 11 and the pull-down driving unit 13. For example, if the pull-up driving unit 11 and the pull-down driving unit 13 are turned on during the transition of the input signal DIN, a direct path is formed between the low voltage VSS terminal and the high voltage VDD terminal and the leakage current may occur.

Thus, in the inverter 10 provided in a comparison example, a current consumption may be increased due to the leakage current, and operation reliability may be reduced due to the signal delay.

Figure 5:
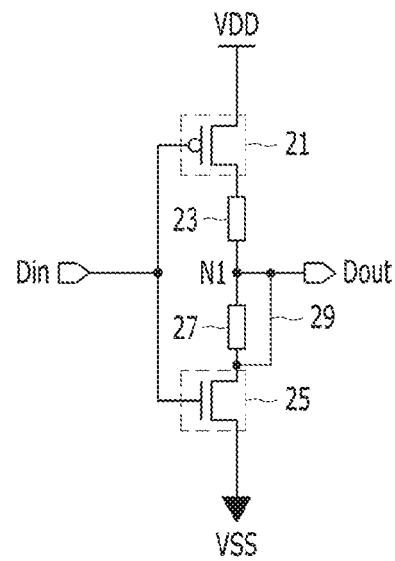
FIG. 5 is a configuration diagram of an exemplary inverter explaining one implementation of the present disclosure.

FIG. 5 is a configuration diagram of an inverter that is provided for explaining a concept of the present disclosure.

Referring to FIG. 5, an inverter 20 in accordance with the present disclosure includes a pull-up driving unit 21, a path switching unit 23, a pull-down driving unit 25, a path blocking unit 27 and a bypass unit 29.

The pull-up driving unit 21 drives the output node N1 with the high voltage VDD in response to the input signal DIN. The pull-up driving unit 21 may include a PMOS transistor having a gate coupled to the input node which receives the input signal and a source and a drain coupled between the path switching unit 23 and a high voltage VDD terminal.

The path switching unit 23 selectively interconnects a path between the pull-up driving unit 21 and the output node N1 according to a direction of a first current which flows between the pull-up driving unit 21 and the output node N1. The path switching unit 23 is closed to interconnect a path between the output node N1 and the pull-up driving unit 21 when the first current flows from the pull-up driving unit 21 to the output node N1. The path switching unit 23 is opened to disconnect the path between the pull-up driving unit 21 and the output node N1 when the first current flows from the output node N1 to the pull-up driving unit 21. For example, the path switching unit 23 may include the MTJ shown in FIGS. 1, 2A and 2B.

The pull-down driving unit 25 drives the output node N1 with the low voltage VSS in response to the input signal DIN. The pull-down driving unit 25 may include an NMOS transistor having a gate coupled to the input node, and a source and a drain coupled between the output node N1 and a low voltage VSS terminal.

The path blocking unit 27 blocks a path between the pull-down driving unit 25 and the output node N1. The patch blocking unit 27 blocks a second current which flows from the output node N1 to the pull-down driving unit 25 when the first current flows through the path switching unit 23. That is, the path blocking unit 27 blocks a direct path formed between the high voltage VDD terminal and the low voltage VSS terminal when the first current flows through the path switching unit 23. For example, the path blocking unit 27 may include a resistance element or a magnetic tunnel junction (MTJ) element. If the path blocking unit 27 includes the MTJ element, the path switching unit 23 and the path blocking unit 27 may operate in the same manner or the opposite manner according to the direction of the first current and the second direction.

The bypass unit 29 forms a bypass path between the pull-down driving unit 25 and the output node N1. The bypass unit 29 may provide a current path in which a third current flows from the output node N1 to the pull-down driving unit 25 when the pull-down driving unit operates.

Figure 6:
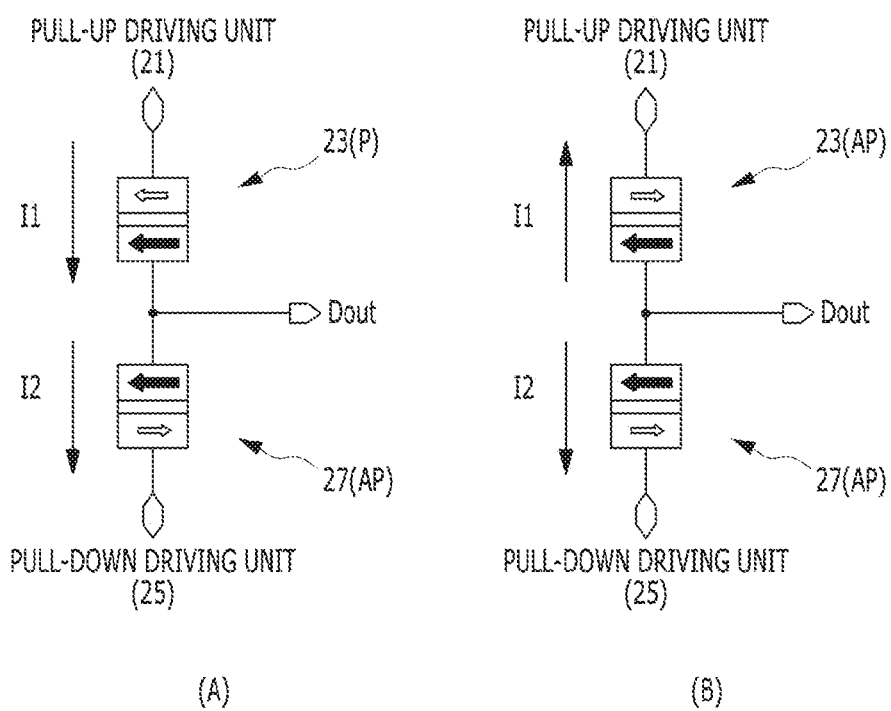
FIG. 6 is an example of a configuration diagram illustrating a path switching unit and a path blocking unit shown in FIG. 5.

FIG. 6 is an example of a configuration diagram illustrating a path switching unit and a path blocking unit each including an MTJ element.

Referring to FIG. 6, each of the path switching unit 23 or the path blocking unit 27 includes a first magnetic layer, a second magnetic layer and a tunnel barrier between the first and second magnetic layers. In the path switching unit 23, a second magnetic layer (for example, the pinned ferromagnetic layer) may be disposed to be more adjacent to the output node than the first magnetic layer (for example, the free ferromagnetic layer), while the tunnel barrier layer is disposed between the first and second magnetic layers. In the path blocking unit 27, the first magnetic layer (for example, the free ferromagnetic layer) may be disposed to be more adjacent to the output node than the second magnetic layer (for example, the pinned ferromagnetic layer).

In a configuration in which the first current I1 flows from the pull-up driving unit 21 to the output node, and the second current I2 flows from the output node to the pull-down driving unit 25, a magnetization direction of the free ferromagnetic layer and a magnetization direction of the pinned ferromagnetic layer are parallel in the path switching unit 23, and thus, the path switching unit 23 may be in a low resistance state of the corresponding MTJ and thus is deemed to be closed. In the path blocking unit 27, the magnetization direction of the free ferromagnetic layer and the magnetization direction of the pinned ferromagnetic layer are anti-parallel, and thus, the path blocking unit 27 may be in a high resistance state and thus is deemed to be opened. This case is illustrated in FIG. 6A. On the other hand, in another configuration in which the first current I1 flows from the output node to the pull-up driving unit 21, and the second current I2 flows from the output node to the pull-down driving unit 25, the magnetization direction of the free ferromagnetic layer and the magnetization direction of the pinned ferromagnetic layer are anti-parallel in the path switching unit 23, and thus, the path switching unit 23 may be in the high resistance state, and is deemed to be in an open state. In the path blocking unit 27, the magnetization direction of the free ferromagnetic layer and the magnetization direction of the pinned ferromagnetic layer are parallel, and thus, the path blocking unit 27 may become in the low resistance state, and be closed (namely, a short state). This case is illustrated in FIG. 6B.

Hereinafter, an operation of the inverter 20 having the above-mentioned configuration will be described.

In a case that the input signal DIN has a low logic level, if the input signal DIN is transitioned from the high logic level to the low logic level, the pull-up driving unit 21 is switched or turned on and the pull-down driving unit 25 is switched or turned off. The high voltage VDD is provided to the output node through the pull-up driving unit 21, and the first current I1 flows from the pull-up driving unit 21 to the output node. Thus, the output signal DOUT having a high logic level is outputted from the output node.

In this case, the pull-down driving unit 25 may be turned on due to manufacturing properties. Thus, the second current I2 may flow from the output node to the pull-down driving unit 25. Herein, since the second current I2 is the leakage current, the second current I2 may be blocked by the path blocking unit 27. For example, if the path blocking unit 27 includes the MTJ element, since the path blocking unit 27 is open according to a direction of the second current I2, the second current I2 may be blocked. Meanwhile, as the second current I2 is blocked by the path blocking unit 27, a third current may flow from the output node to the pull-down driving unit 25 through the bypass unit 29. The third current may be also blocked according to a resistance element of the bypass unit 25.

Thus, when the input signal DIN is transitioned from the high logic level to the low logic level, since the direct path is not formed between the high voltage VDD terminal and the low voltage VSS terminal, the leakage current may be blocked.

Next, in case that the input signal DIN has a high logic level, if the input signal DIN is transitioned from the low logic level to the high logic level, the pull-up driving unit 21 is switched or turned off and the pull-down driving unit 25 is switched or turned on. The low voltage VSS is provided to the path blocking unit 27 through the pull-down driving unit 25 and the third current flows from the output node to the pull-down driving unit 25. Thus, the output signal DOUT having the low logic level is outputted from the output node.

In this case, the pull-up driving unit 25 may be turned on due to manufacturing properties. Thus, the first current I1 may flow from the pull-up driving unit 21 to the output node. Herein, since the first current I1 is the leakage current, the first current I1 may be blocked by the path switching unit 23. Although the path switching unit 23 is in the short state according to the direction of the first current I1, the first current I1 may be blocked by an intrinsic resistance element of the path switching unit 23 since the first current may be the leakage current having small amount of current.

Since the path blocking unit 27 maintains the state to block a current according to the direction of the second current I2, the third current may flow through the bypass unit 29. Further, the path switching unit 23 may avoid forming a reverse current which flows from the output node to the pull-up driving unit 21 as illustrated in FIG. 6(B).

The inverter 20 in accordance with the present disclosure may prevent a current consumption caused by a leakage current and improve operation reliability.

Figure 7:
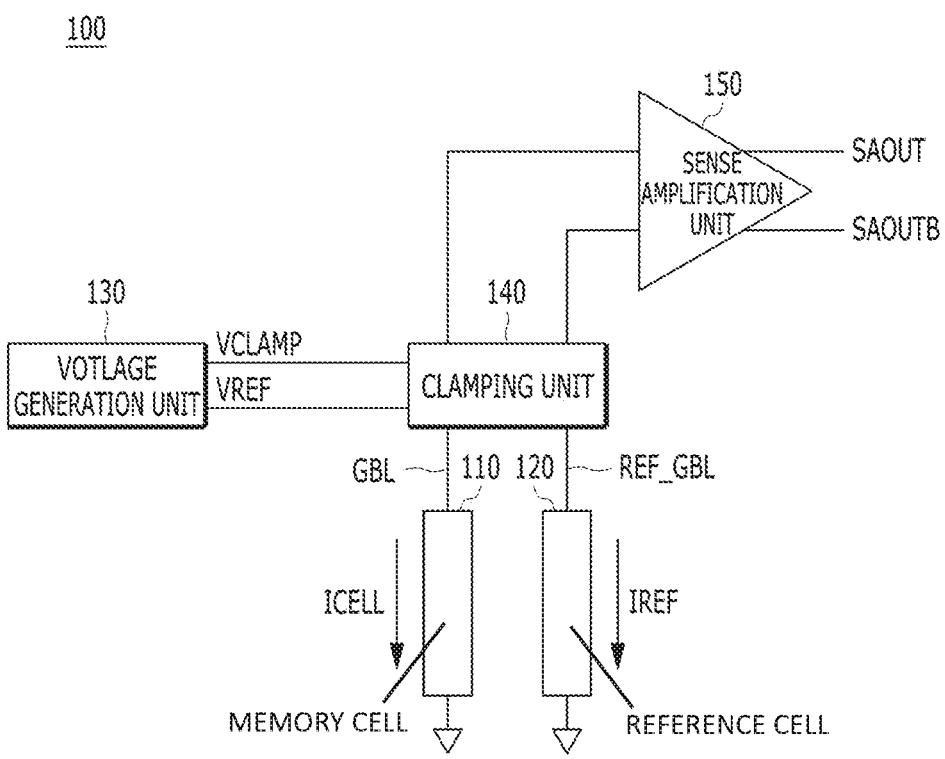
FIG. 7 is an example of a configuration diagram illustrating a semiconductor memory device in accordance with an implementation of the present disclosure.

FIG. 7 is an example of a configuration diagram illustrating a semiconductor memory device in accordance with an implementation of the present disclosure.

Referring to FIG. 7, a semiconductor memory device 100 includes a memory cell 110, a reference cell 120, a voltage generation unit 130, a clamping unit 140 and a sense amplification unit 150.

The memory cell 110 stores data, and may include the variable resistance element R and the transistor ST as described in FIGS. 1 and 2B.

The reference cell 120 stores a reference data corresponding to the data stored in the memory cell 110. The reference cell 120 may be implemented by modeling the memory cell 110. Thus, the reference cell 120 may be implemented in the similar manner as the memory cell. The reference cell 120 may have a resistance value between those in the low resistance state and the high resistance state of the variable resistance element R included in the memory cell 110.

The voltage generation unit 130 generates a read voltage VCLAMP and a reference voltage VREF during a read operation mode. The voltage generation unit 130 may include a voltage generator and continuously generate the reference voltage VREF and the reference voltage VREF each having a predetermined voltage level.

The clamping unit 140 clamps a cell current ICELL which flows on the memory cell 110 and a reference current IREF which flows on the reference cell 120.

The sense amplification unit 150 may include a latch typed sense amplifier for generating differential read data SAOUT and SAOUTB by sensing and amplifying the data and the reference data in response to the cell current ICELL and the reference current IREF.

More specifically, the clamping unit 140 and the sense amplification unit 150 will be described in details with reference to FIG. 8.

Figure 8:
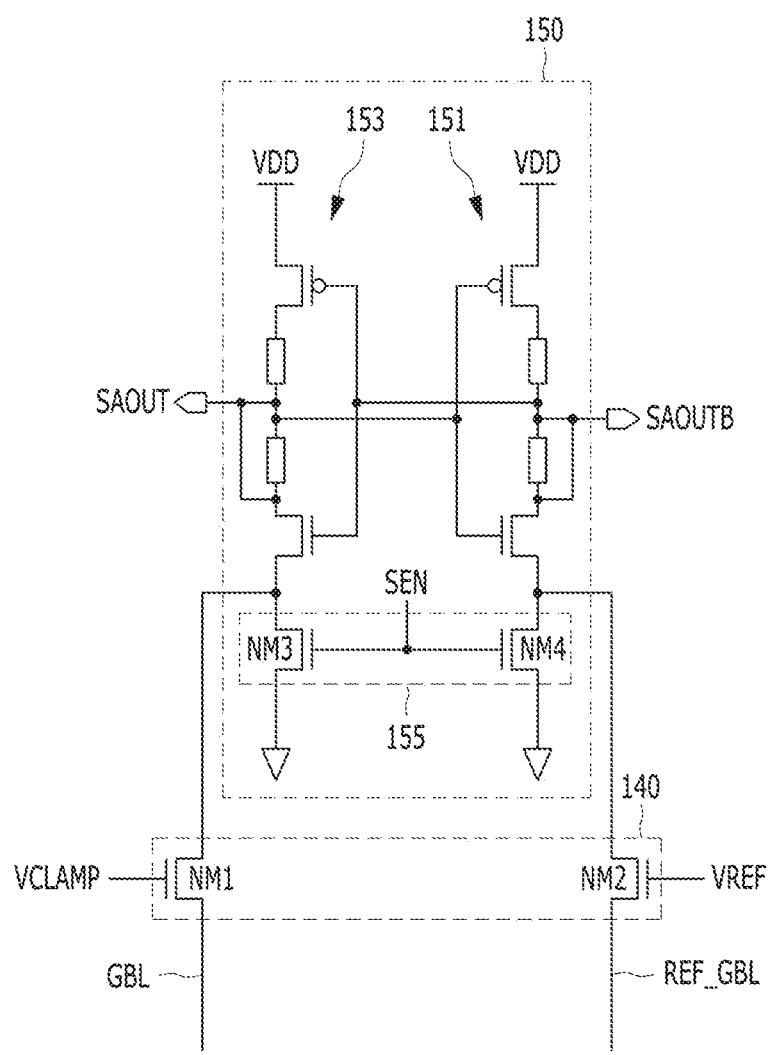
FIG. 8 is an example of a configuration diagram illustrating a clamping unit and a sense amplification unit shown in FIG. 7.

FIG. 8 is an example of a configuration diagram illustrating a clamping unit and a sense amplification unit shown in FIG. 7.

Referring to FIG. 8, the clamping unit 140 may include a first NMOS transistor NM1 and a second NMOS transistor NM2. The first NMOS transistor NM1 has a gate for receiving the read voltage VCLAMP, and a source and a gate, which are coupled between a terminal of the sense amplification unit 150 and a data line GBL coupled to the memory cell 110. The second NMOS transistor NM2 has a gate for receiving the reference voltage VREF and a source and and drain, which are coupled between the other terminal of the sense amplification unit 150 and a reference data line REF_GBL coupled to the reference cell 120.

The sense amplification unit 150 may include a first inverter 151, a second inverter 153 and a coupling unit 155. The first inverter 151 receives a positive read data SAOUT between the differential read data SAOUT and SAOUTB and outputs a negative read data SAOUTB between the differential read data SAOUT and SAOUTB. The second inverter 153 receives the negative read data SAOUTB and outputs the positive read data SAOUT. The detailed descriptions of the first inverter 151 and the second inverter 153 will be omitted since the first inverter 151 and the second inverter 153 have the same configuration as the inverter 20 as shown in FIG. 5.

The coupling unit 155 controls an enable state of the first inverter 151 and the second inverter 153 in response to a control signal SEN. The coupling unit 155 may include a third NMOS transistor NM3 and a fourth NMOS transistor NM4.

The third NMOS transistor NM3 has a gate for receiving the control signal SEN and a drain and a source, which are coupled between a low voltage VSS terminal and a pull-down driving unit of the first inverter 151. The fourth NMOS transistor NM4 has a gate for receiving the control signal SEN and a drain and a source, which are coupled between a low voltage VSS terminal and a pull-down driving unit of the second inverter 153.

For reference, the reference cell 120 may be coupled to a node between the coupling unit 155 and the pull-down driving unit of the first inverter 151, and the memory cell 110 may be coupled to a node between the coupling unit 155 and the pull-down driving unit of the second inverter 153.

Hereinafter, an operation of the semiconductor memory device will be described with reference to the above-descriptions.

The data corresponding to a predetermined logic level may be stored on the memory cell during a write mode. For example, if the data corresponding to a low logic level is stored on the memory cell 110, the variable resistance element R of the memory cell 110 may be in the low resistance state, and if the data corresponding to a high logic level is stored on the memory cell, the variable resistance element R of the memory cell 110 may be in the high resistance state.

If the read operation mode starts, the voltage generation unit 130 may generate the read voltage VCLAMP and the reference voltage VREF, and the clamp unit 140 may clamp the cell current ICELL which flows through the memory cell 110 and the reference current IREF which flows through the reference cell 120.

The sense amplification unit 150 compares the cell current ICELL with the reference current IREF, senses and amplifies the data stored on the memory cell 110 based on the comparison result, and generates the differential read data SAOUT and SAOUTB. When the sense amplification unit 150 generates the differential read data SAOUT and SAOUTB, since the leakage current and the signal delay may be prevented using the path switching unit, the path blocking unit and the bypass unit, the reliability of the sense and amplification operation may be improved.

In the exemplary implementations in accordance with the present disclosure, as the reliability of the sense and amplification operation is improved, a read operation may be stably performed.

The above and other memory circuits or semiconductor devices based on the disclosed technology may be used in a range of devices or systems. FIGS. 9-13 provide some examples of devices or systems that may implement the memory circuits disclosed herein.

In FIGS. 9-13, a memory device (e.g., memory unit 1010 in FIG. 9, a cache memory unit 1120 in FIG. 10, etc.) may be configured based on the disclosed technology to achieve one or more desired benefits. For example, in one implementation, such a memory device can include a memory cell configured to store data; and a sense amplification unit configured to sense and amplify the data stored in the memory cell and to generate a differential read data representing a difference between a first read data and a second read data during a read operation, wherein the sense amplification unit comprises: a first pull-up driving unit configured to receive the first read data as an input thereof and drive an output node having the second read data with a high voltage; a first path switching unit configured to selectively connect a path between the first pull-up driving unit and the output node having the second read data according to a direction of a first current flowing between the first pull-up driving unit and the output node; a first pull-down driving unit configured to receive the first read data as an input thereof and drive the output node having the second read data with a low voltage; a first path blocking unit configured to block a path between the first pull-down driving unit and the output node having the second read data; a first bypass unit configured to form a bypass path between the output node having the second read data and a node between the first path blocking unit and the first pull-down driving unit; a second pull-up driving unit configured to receive the second read data as an input thereof and drive the output node having the first read data with the high voltage; a second path switching unit configured to selectively connect a path between the second pull-up driving unit and the output node having the first read data according to a direction of a second current flowing between the second pull-up driving unit and the output node having the positive read data; a second pull-down driving unit configured to receive the second read data as an input thereof and drive the output node having the first read data with the low voltage; a second path blocking unit configured to block a path between the second pull-down driving unit and the output node having the first read data; and a second bypass unit configured to form a bypass path between the output node having the first read data and a node between the second pull-down driving unit and the second path blocking unit.

Figure 9:
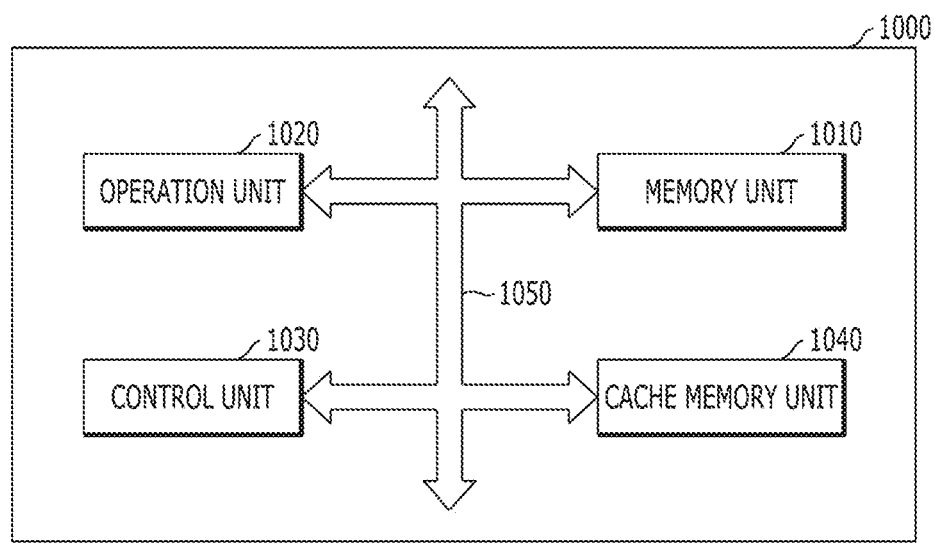
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit may include a memory cell configured based on the disclosed technology to perform a stable sensing and amplification operation, thereby improving the performance of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
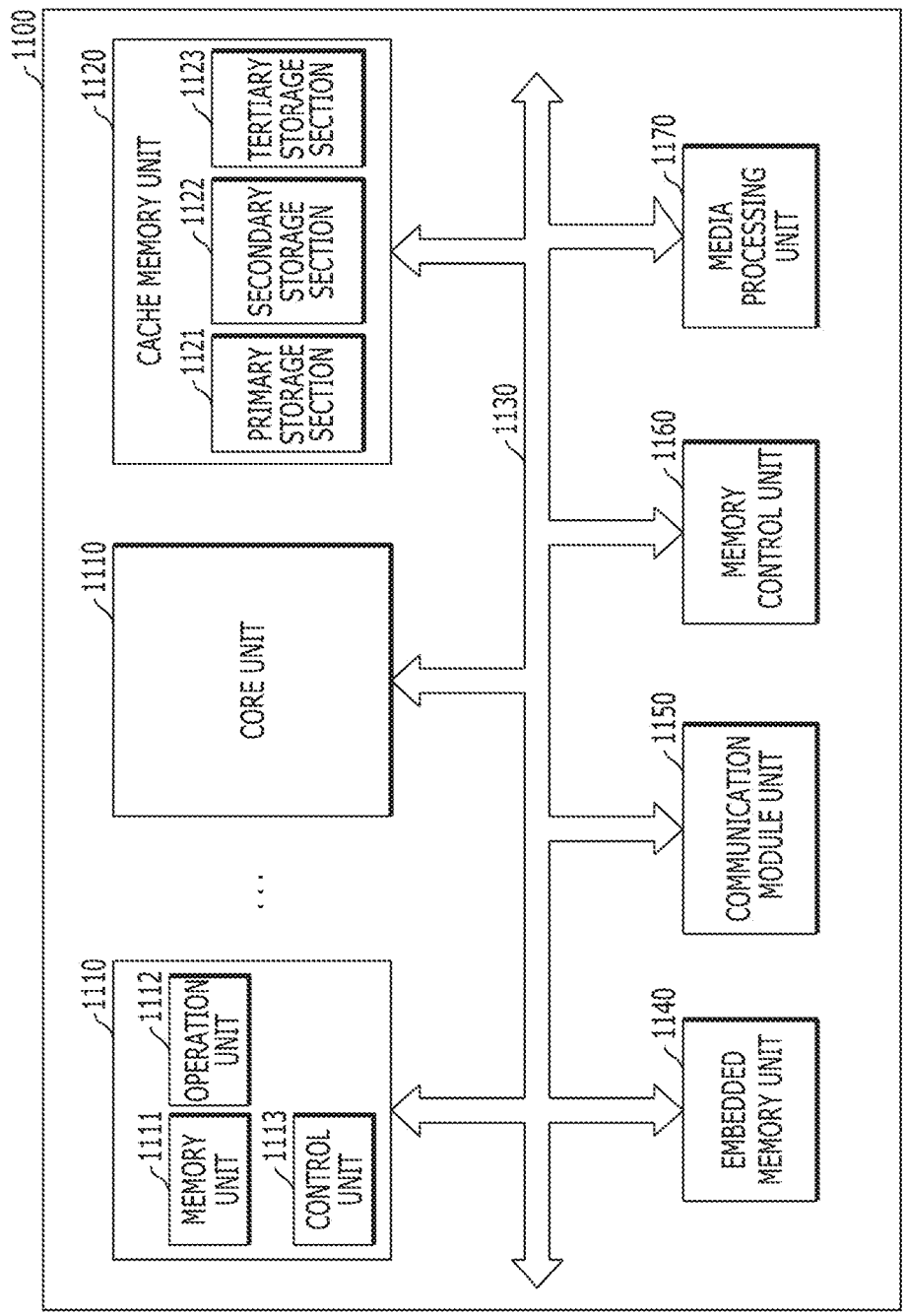
FIG. 10 is an example of configuration diagram of a processor implementing memory circuitry based on the disclosed technology.

FIG. 10 is an example of configuration diagram of a processor implementing memory circuitry based on the disclosed technology. Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory cell configured based on the disclose technology to perform a stable sense and amplification operation, thereby improving the performance of the processor 1100.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
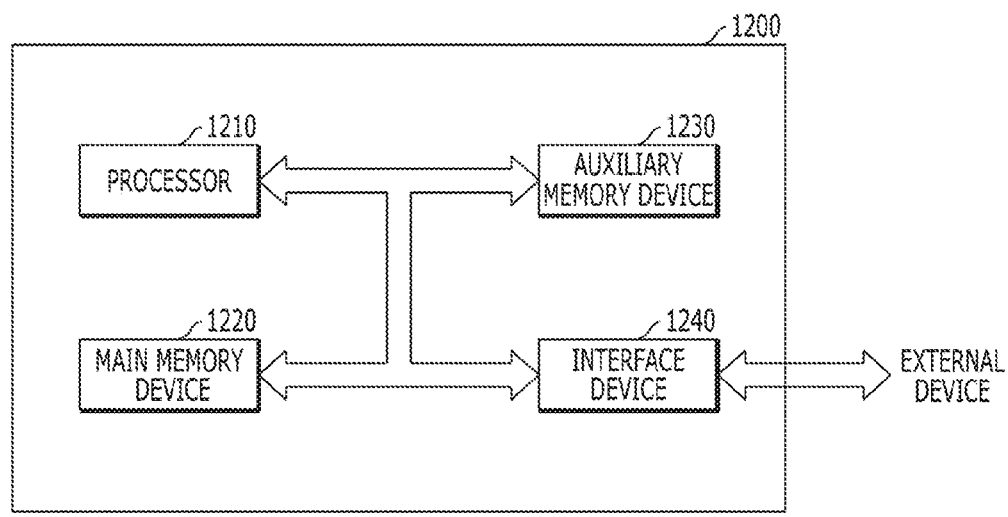
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may be configured based on the disclosed technology to perform performing a stable sense and amplification operation, thereby improving the performance of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory cell configured based on the disclosed technology to perform a stable sense and amplification operation, thereby improving the performance of the system 1200.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
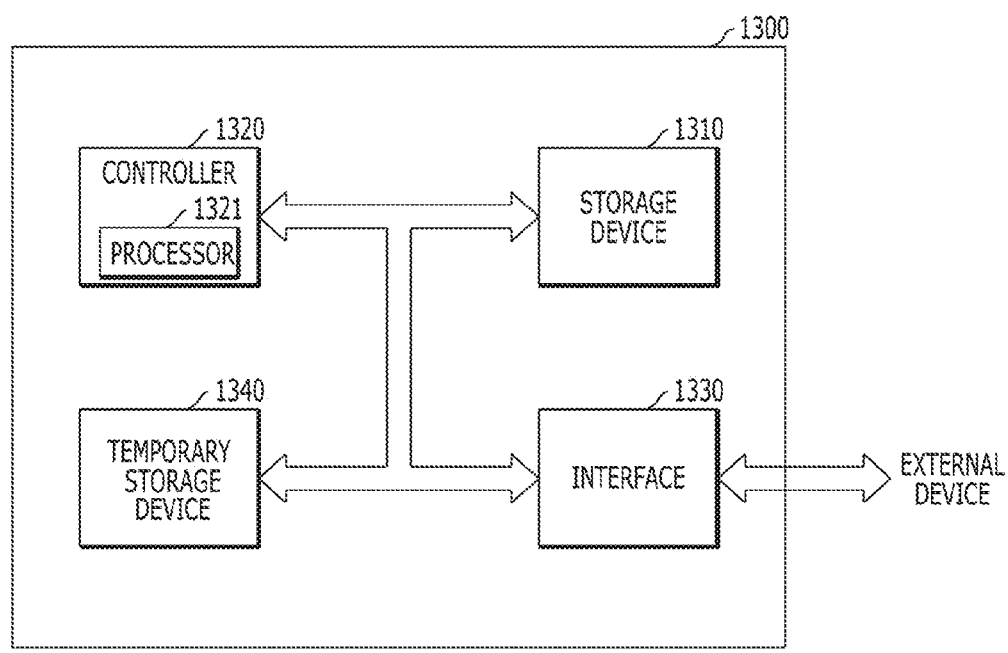
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a memory cell configured based on the disclosed technology to perform a stable sense and amplification operation, thereby improving the performance of the data storage system 1300.

Figure 13:
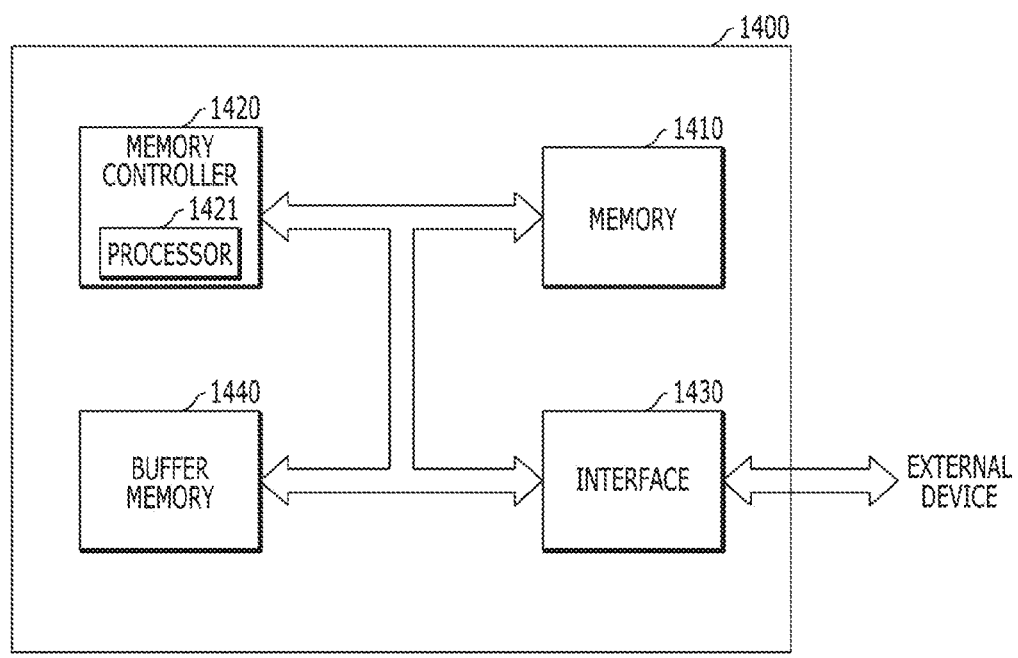
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. Through this, the performance of the memory system 1400 may be improved by performing a stable sense and amplification operation.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device, comprising an inverter which includes:
    an inverter input node to receive an inverter input;
    an inverter output node to produce an inverter output corresponding to the inverter input;
    a first voltage terminal at a first voltage;
    a second voltage terminal at a second voltage;
    a pull-up driving unit coupled to the first voltage terminal and the inverter output node and configured to drive the inverter output node at the first voltage;
    a pull-down driving unit coupled to the second voltage terminal and the inverter output node and configured to drive the inverter output node at the second voltage;
    a path switching unit coupled between the pull-up driving unit and the inverter output node and configured to modify a connection property of a pull-up path between the pull-up driving unit and the inverter output node in response to a direction of a first current flowing in the pull-up path;
    a path blocking unit coupled between the inverter output node and the pull-down driving unit and configured to provide a high resistance in a path between the first and second voltage terminals; and
    a bypass unit coupled to form a bypass path that directly couples the inverter output node to a node between the pull-down driving unit and the path blocking unit.

2. The electronic device of claim 1, wherein the path switching unit or the path blocking unit includes a variable resistance element that exhibits different resistance states.

3. The electronic device of claim 1, wherein the path switching unit or the path blocking unit includes a magnetic tunnel junction (MTJ) element.

4. The electronic device of claim 1, wherein the path switching unit or the path blocking unit includes a phase change element.

5. The electronic device of claim 1, wherein the path blocking unit is operable to change a resistance state to selectively connect the path between the pull-down driving unit and the inverter output node according to a direction of a second current flowing between the pull-down driving unit and the output node.

6. The electronic device of claim 5, wherein the path switching unit and the path blocking unit perform a same operation when the direction of the first current is opposite to the direction of the second current, and perform an opposite operation when the direction of the first current is same as the direction of the second current.

7. The electronic device of claim 6, wherein each of the path switching unit and the path blocking unit includes a magnetic tunnel junction (MTJ) element.

8. The electronic device of claim 7, wherein the path switching unit includes a free ferromagnetic layer and a pinned ferromagnetic layer, and the pinned ferromagnetic layer is disposed closer to the inverter output node than the free ferromagnetic layer.

9. The electronic device of claim 7, wherein the path blocking unit includes a free ferromagnetic layer and a pinned ferromagnetic layer, and the free ferromagnetic layer is disposed closer to the inverter output node than the pinned ferromagnetic layer.

10. The electronic device of claim 1, wherein the path switching unit includes a magnetic tunnel junction (MTJ) element and the path blocking unit includes a resistance element.

11. The electronic device of claim 10, wherein the path switching unit includes a free ferromagnetic layer and a pinned ferromagnetic layer, and the pinned ferromagnetic layer is disposed more adjacent to the inverter output node than the free ferromagnetic layer.

* * * * *